US008831048B2

(12) United States Patent
Nakai

(10) Patent No.: US 8,831,048 B2
(45) Date of Patent: Sep. 9, 2014

(54) FIBER LASER

(71) Applicant: Fujikura Ltd., Tokyo (JP)

(72) Inventor: Michihiro Nakai, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/957,671

(22) Filed: Aug. 2, 2013

(65) Prior Publication Data
US 2014/0036938 A1 Feb. 6, 2014

(30) Foreign Application Priority Data

Aug. 3, 2012 (JP) ................................. 2012-173078

(51) Int. Cl.
| *H01S 3/067* | (2006.01) |
| *H01S 3/10* | (2006.01) |
| *H01S 5/00* | (2006.01) |
| *H01S 3/102* | (2006.01) |
| *H01S 3/16* | (2006.01) |
| *H01S 3/00* | (2006.01) |
| *H01S 3/0941* | (2006.01) |
| *H01S 3/094* | (2006.01) |

(52) U.S. Cl.
CPC ............. *H01S 5/0064* (2013.01); *H01S 3/1618* (2013.01); *H01S 3/06754* (2013.01); *H01S 2301/02* (2013.01); *H01S 3/0064* (2013.01); *H01S 3/0085* (2013.01); *H01S 3/09415* (2013.01); *H01S 3/0078* (2013.01); *H01S 3/10015* (2013.01); *H01S 3/094007* (2013.01); *H01S 3/1022* (2013.01)

USPC ............................................................. 372/6

(58) Field of Classification Search
CPC . H01S 3/067; H01S 3/06708; H01S 3/06754; H01S 3/094003; H01S 3/1603; H01S 3/1618
USPC ............................................................. 372/6
See application file for complete search history.

(56) References Cited

U.S. PATENT DOCUMENTS

| 5,784,395 A * | 7/1998 | Smith et al. .................. 372/26 |
| 7,436,863 B2 * | 10/2008 | Matsuda et al. ................. 372/6 |
| 2010/0272136 A1 * | 10/2010 | Kakui ............................ 372/25 |

FOREIGN PATENT DOCUMENTS

| JP | 03-235924 A | 10/1991 |
| JP | 2001-083557 A | 3/2001 |

* cited by examiner

*Primary Examiner* — Xinning Niu
(74) *Attorney, Agent, or Firm* — Westerman, Hattori, Daniels & Adrian, LLP

(57) ABSTRACT

A fiber laser includes a light emitting unit that amplifies pulsed signal light in a rare-earth doped fiber and emits output light, and a filter arranged in an optical path of the output light emitted from the light emitting unit. The signal light is light having a longer wavelength than a wavelength with which a gain is maximized in a rare-earth doped fiber within a gain wavelength band of the rare-earth doped fiber. The filter does not allow transmission of light in at least a part of the wavelength band that includes the wavelength with which the gain is maximized in the rare-earth doped fiber, and allows transmission of light having the same wavelength as the signal light and light in a wavelength band on a longer wavelength side than the wavelength of the signal light.

18 Claims, 2 Drawing Sheets

FIBER LASER

BACKGROUND OF THE INVENTION

The present invention relates to a fiber laser configured to suppress internal damage caused by reflected light, while also avoiding a decline in the intensity of output light.

A fiber laser that amplifies and emits signal light through a rare-earth doped fiber is utilized as one of the laser devices employed in processing machines and medical equipment that use laser beams, such as a surgical knife. A fiber laser of this type may emit large pulsed output light, in which a duty ratio, i.e., a ratio between an OFF time and an ON time is, for example, 10:1. Such a fiber laser with a large duty ratio may emit amplified spontaneous emission (ASE) light in a state where the pulsed output light is not emitted. A part of the emitted ASE light may be reflected at a body to be processed, that is supposed to be irradiated with the signal light, and may be incident from an emitting end of the fiber laser. When the reflected ASE light is incident on the fiber laser in such a manner, the reflected light is amplified in the rare-earth doped fiber, causing the internal part of the fiber laser (a light source and the like) to potentially be damaged by the reflected light that has been amplified.

Therefore, removal of unnecessary ASE light has been performed. Japanese Patent Application Laid-Open (JP-A) No. 2001-83557 discloses a laser device that removes ASE light with a filter. Further, JP-A No. 03-235924 details a light amplifier that removes ASE light with a filter.

The laser device of JP-A No. 2001-83557, and the optical fiber amplifier of JP-A No. 03-235924 are configured in such a manner that the signal light emitted from a light source is amplified in a rare-earth doped fiber that is then transmitted through a filter. A wavelength band of the light that is to be transmitted through the filter is narrowed in accordance with the wavelength band of the signal light so that only the light with the same wavelength as the signal light can be transmitted. The wavelength band of the light to be transmitted through the filter and the wavelength band of the signal light are in accordance with each other, such that only the signal light can be transmitted through the filter, with the ASE light that is not transmitted through the filter being removed.

SUMMARY OF THE INVENTION

As described above, with the filter being arranged between the rare-earth doped fiber and laser emitting end of the fiber laser, the following feed back process can be suppressed; the ASE light emitted from rare-earth doped fiber is reflected at somewhere outside of the fiber laser and go back into the fiber laser, then that is amplified in the rare-earth doped fiber.

However, when the filters disclosed in JP-A No. 2001-83557 and JP-A No. 03-235924, i.e., those filters, in which the wavelength band of light to be transmitted through the filters is narrowed, are arranged between the rare-earth doped fiber and laser emitting end of the fiber laser, the intensity of the amplified pulsed signal light may be declined when the amplified pulsed signal light is transmitted. Further, it has been revealed that the degree to which light output intensity is declined tends to heighten as the output of higher intensity light is attempted.

Further, in the case where the ASE light that is emitted between pulses, is reflected at the surface of objects to be processed and the like, and goes back into the rare-earth doped fiber again, even if the part of the reflected ASE light is left unremoved, internal damage of the fiber laser can be sufficiently suppressed.

Therefore, the present invention has been made in light of the results from the study described above. An objective of the present invention is to provide a fiber laser that is configured to suppress internal damage caused by reflected light, while also avoiding a decline in the intensity of the output light.

A fiber laser of the present invention includes: a light emitting unit including a pumping light source configured to emit pumping light, and a rare-earth doped fiber on which the pumping light is incident, and to which a rare-earth element that is to be pumped by the pumping light is doped, the light emitting unit being configured to amplify pulsed signal light in the rare-earth doped fiber and to output light including the signal light; and a filter arranged in an optical path of the output light emitted from the light emitting unit. A wavelength of the signal light is longer than a wavelength with which a gain is maximized in the rare-earth doped fiber within a gain wavelength band of the rare-earth doped fiber. The filter does not allow transmission of light in at least apart of a wavelength band, including the wavelength with which a gain is maximized in the rare-earth doped fiber, and allows transmission of light with the same wavelength as the signal light and light in a wavelength band on a side with a longer wavelength than the wavelength of the signal light.

In fiber lasers that amplify and emit pulsed signal lights, such as the device in the present invention, ASE light may be emitted by the spontaneous emission of the rare-earth element pumped by the pumping light when the pulsed signal light is amplified, and the output light is emitted. However, in the fiber laser of the present invention, even in the case where the ASE light is emitted, at a minimum, the portion of the ASE light having an amplified wavelength with a maximum gain in the rare-earth doped fiber would be filtered rather than emitted. Therefore, even in the case where the ASE light is emitted and reflected at a body to be irradiated of light, such as a body to be processed, and is then incident on the fiber laser again, the reflected light would not include light with a wavelength amplified with a maximum gain in the rare-earth doped fiber. Through the amplification of light with a wavelength that has had its maximum gain removed, the amplification of reflected light with a high gain in the rare-earth doped fiber can be avoided. Therefore, internal damage caused by the reflected light can also be suppressed.

Further, one of the objectives of amplifying the pulsed signal light is to emit the output light with a maximum gain at each pump-power level. When the signal light is amplified with a high gain, and the high intensity light propagates in the rare-earth doped fiber, a part of the signal light amplified by nonlinear optical effect may shift toward the side of the longer wavelength. This effects results in the change of wavelength spectrum. However, according to the fiber laser of the present invention, even in the case where the output light includes light that has shifted toward the side of the longer wavelength rather than the signal light, the light that has shifted toward the longer wavelength side can be transmitted through the filter. Therefore, a decline in the intensity of the output light transmitted through and emitted from the filter can be avoided. Note that when the signal light is amplified and the output light is emitted, the output light does not include ASE light. The ASE light, which has broad wavelength spectrum, emits only in the interval of signal light. On the other hands, amplified signal light has a wavelength that is the same length and longer than that of the signal light. Therefore, even if the output light passes through the filter, an event which prevents transmission of light on the side with a shorter wavelength than that of the signal light, the decline in the intensity of the output light is minimal.

Thus, according to the fiber laser of the present invention, internal damage caused by reflected light can be suppressed, while also avoiding a decline in the intensity of the output light.

Note that the signal light in the present invention refers to light that is incident on, amplified in, and emitted from the rare-earth doped fiber. It is unnecessary for the signal to contain any kind of "information".

Further, it is preferable that the filter does not allow transmission of all light on a wavelength that is shorter than that of the signal light within the gain wavelength band of the rare-earth doped fiber.

By preventing transmission of all light on a shorter wavelength than that of the signal light, the light on a shorter wavelength can be removed from the reflected light of the ASE light, further suppressing internal damage caused by the reflected light.

Further, it is preferable that the light emitting unit also includes a light detection unit configured to detect intensity of the light proceeding in a direction opposite to an emitting direction of the signal light. Further, it is preferable that the light emitting unit contains a control unit configured to control the pumping light source, which controls the intensity of the pumping light, and contracts when it determines that the light proceeding in a direction opposite to an emitting direction of the signal light has reached or surpassed a predetermined intensity. That predetermination is based on output from the light detection unit.

The intensity of the reflected light can be monitored by detecting the intensity of the light proceeding in a direction opposite to an emitting direction of the signal light. Therefore, where the light proceeding in a direction opposite to the emitting direction of the signal light enlarges for some reason or another, the internal damage due to the reflected light can be further suppressed by reducing a gain by the rare-earth doped fiber through the determination that the reflected light has intensified. In particular, the internal damage caused by the reflected light can be further suppressed by detecting light with the same wavelength as that of the signal light, and by performing the above-described control.

Further, it is preferable that an optical isolator which allows for the transmission of light proceeding in the same direction as the output light and suppresses the incidence of light on the light emitting unit, the light proceeding in a direction opposite to the travel direction of the output light, is provided in the optical path of the output light between the light emitting unit and the filter.

Since the incidence of reflected light on the rare-earth doped fiber of a light emitting unit can be avoided by an optical isolator, internal damage resulting from reflected light can be further suppressed.

Further, it is preferable that the rare-earth element is ytterbium, the signal light is light, having a wavelength of 1070 nm or more, and the filter prevents transmission of light with a wavelength shorter than 1070 nm, at least within the gain wavelength band of the rare-earth doped fiber.

The rare-earth doped fiber that uses ytterbium as an amplifying medium has a large gain and can emit high intensity light. However, a part of the amplified signal light is more likely to shift toward the side of a longer wavelength by nonlinear optical effect. Nevertheless, according to the present invention, since the light on the side with a longer wavelength than that of the signal light can be transmitted through the filter, the decline in output light intensity can be avoided.

Further, the light emitting unit may also include a signal light source configured to emit pulsed signal light from which the signal light emitted may be incident on the rare-earth doped fiber.

Under such a configuration, the fiber laser can be a master oscillator power amplifier type (MO-PA) fiber laser. With damage to the signal light source resulting from reflected light being suppressed, a highly reliable fiber laser can be realized.

Furthermore, the light emitting unit may also include a first mirror provided on a side opposite to an emitting side of the rare-earth doped fiber. This first mirror should be configured to reflect light having a wavelength equal to that of the signal light. Additionally, a second mirror provided on the emitting side of the rare-earth doped fiber, and configured to reflect light having a wavelength equal to the wavelength of the light reflected by the first mirror (with lower reflectance than the first mirror) may also be included. Moreover, an optical switch placed between the first mirror and the second mirror, and configured to cause light having a wavelength equal to that of the signal light to repeat a low- and high-loss state, wherein the signal light may be light resonating between the first mirror and the second mirror, may also be included.

With such a configuration, a resonating fiber laser in which the signal light resonates can be realized, and the pulsed output light can be emitted by an optical switch. Further, through the reflection of the light that is being amplified, break down of the resonance structure can be suppressed, enabling realization of a highly reliable fiber laser.

As described above, based on the present invention, a fiber laser configured to suppress internal damage resulting from reflected light, while avoiding a decline in output light intensity, is provided.

DETAILED DESCRIPTION OF THE INVENTION

Hereinafter, preferable embodiments of a fiber laser according to the present invention will be described in detail with reference to the drawings.
(First Embodiment)

Figure 1:
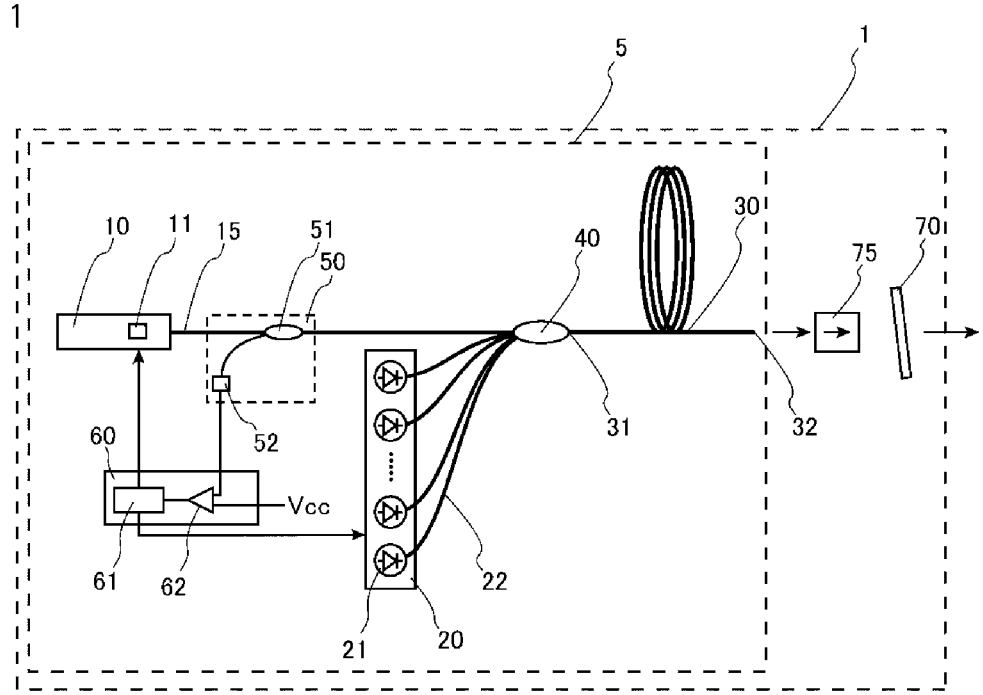
FIG. 1 is a diagram illustrating a fiber laser according to a first embodiment of the present invention.

FIG. 1 is a diagram illustrating a fiber laser according to a first embodiment of the present invention.

As illustrated in FIG. 1, a fiber laser 1 includes, as a main configuration, a light emitting unit 5 that emits output light through the amplification of a signal light, a filter 70 that transmits the output light emitted from the light emitting unit 5, and an optical isolator 75, provided in an optical path of the output light between the light emitting unit 5 and filter 70. Further, the light emitting unit 5 includes, as a main configuration, a signal light source 10 that emits signal light, a pumping light source 20 that emits pumping light, a rare-earth doped fiber 30 on which the signal light and the pumping light are incident, a combiner 40 used for entering the signal light and pumping light into the rare-earth doped fiber 30, a light detection unit 50 arranged between the signal light source 10 and the rare-earth doped fiber 30, and a control unit 60. The fiber laser 1 is, as described above, referred to as an MO-PA type fiber laser, in which the signal light source 10 serves as a master oscillator (MO), with the pumping light source 20 and rare-earth doped fiber 30 serving as power amplifiers (PA).

The signal light source 10 includes a signal light generation unit (not illustrated), including a laser diode, a Fabry-Pérot type or fiber-ring type fiber laser, and an optical switch 11 that causes light generated in the signal light generation unit to be pulsed signal light. The optical switch 11 includes an acoustic optical modulator (AOM), and is arranged either on the interior or exterior of the signal light generation unit. The optical switch 11 is controlled in such a way that the signal light repeats a low- and high-loss state. The optical switch 11 is controlled in this manner so that the pulsed signal light is emitted from the signal light source 10. Note that with the exception of the AOM, the optical switch 11 may be a micro-machine system, an optical switch, an LN modulator, or the like.

The signal light that is emitted from the signal light source 10 is light with a longer wavelength than that from which a gain is maximized in the rare-earth doped fiber 30 described below. An example would be a laser beam having a wavelength of 1085 nm. Further, the signal light source 10 is connected to a signal light fiber 15 configured from a core and a clad that surrounds the surface circumference of the core without any open space. The signal light emitted from the signal light source 10 propagates through the core of the signal light fiber 15. An example of the signal light fiber 15 includes a single mode fiber, and in this case, the signal light propagates through the signal light fiber 15 as a single mode light.

The pumping light source 20 includes a plurality of laser diodes 21, and outputs a pumping light with a wavelength that pumps a rare-earth element doped to a rare-earth doped fiber, as described below. For example, a pumping light emitting a wavelength of 915 nm. Further, each of the laser diodes 21 of the pumping light source 20 are connected to a pumping light fiber 22, and the pumping light emitted from the laser diode 21 propagates through the pumping light fiber 22. An example of the pumping light fiber 22 would be a multimode fiber. In this case, the pumping light propagates through the pumping light fiber 22 as a multimode light.

The rare-earth doped fiber 30 is an optical fiber configured from a core, a clad that surrounds the surface circumference of the core without any spaces, a resin clad that covers the surface circumference of the clad, a covering layer that covers the surface circumference of the resin clad, and one end portion that serves as an incident end 31, and another end portion that serves as an emitting end 32. The refractive index of the clad is lower than that of the core, and the refractive index of the resin clad is even lower than that of the clad. An example of material that configures the core and is doped includes, quartz, an element such as germanium, which raises the refractive index, and a rare-earth element, such as ytterbium (Yb), which is pumped by the pumping light that is emitted from the pumping light source 20. An example of the rare-earth elements other than the above-described Yb includes: thulium (Tm), cerium (Ce), neodymium (Nd), europium (Eu), and erbium (Er). Further, an example of the material that configures the clad includes pure quartz into which no dopant is doped. Further, an example of the material that configures the resin clad includes a UV-curable resin. Additionally, an example of the material that configures the covering layer includes a UV-curable resin that is different from the resin that configures the resin clad.

Figure 2:
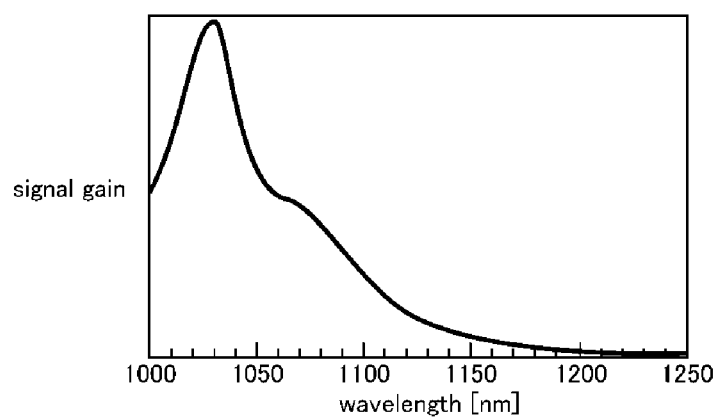
FIG. 2 is a diagram illustrating the relation between a wavelength and a gain of a rare-earth doped fiber when a rare earth to be doped to the rare-earth doped fiber is ytterbium.

The rare-earth element pumped by the pumping light induces emission by the light propagating through the core, so that the rare-earth doped fiber 30 amplifies the light propagating through the core. FIG. 2 is a diagram illustrating the relationship between a gain and a wavelength of the signal light propagating through the rare-earth doped fiber 30 when the rare earth to be doped is ytterbium, and the duty ratio is 10:1. The example of the gain of the rare-earth doped fiber 30 that is illustrated in FIG. 2, has a maximum wavelength around 1030 nm. Therefore, when such a rare-earth doped fiber 30 to which ytterbium is doped is used, a signal light having a wavelength longer than roughly 1030 nm, such as a laser beam with a wavelength of 1085 nm, is emitted from the signal light source 10, as described above.

Further, the maximum gain wavelength of the rare-earth doped fiber 30 can be obtained experimentally by following this simplified method. That is, a continuous signal light is incident on the rare-earth doped fiber 30 from the signal light source 10, and a pumping light, whose power is obtained from the dividing power of the pumping light emitted from the pumping light source 20 under the duty ratio of the signal light, is incident on the rare-earth doped fiber 30. The wavelength with which the signal light is amplified with a maximum gain during this time may be that with which the gain is maximized in the rare-earth doped fiber 30. According to this method, the wavelength can also be obtained by calculation. Note that the above-described "power obtained from the dividing power of the pumping light emitted under the duty ratio," refers to the dividing power of the pumping light emitted when used by 1/10, where the duty ratio of the signal light is, for example, 10:1. In such a case, the power obtained is ten times greater than the power obtained from the emission of the pumping light when it is in use.

The combiner 40 connects the signal light fiber 15 and the pumping light fibers 22, and the incident end 31 of the rare-earth doped fiber 30. Specifically, in the combiner 40, the core of the signal light fiber 15 is connected to the core of the rare-earth doped fiber 30, and a core of each of the pumping light fibers 22 is connected to the clad of the rare-earth doped fiber 30. Therefore, the signal light emitted from the signal light source 10 is incident on the core of the rare-earth doped fiber 30, and the pumping light emitted from the pumping light source 20 is incident on the clad of the rare-earth doped fiber 30.

The light detection unit 50 includes a light separation unit 51 provided in the middle of the signal light fiber 15, and a photoelectric conversion unit 52 that converts the light intensity separated by the light separation unit 51 into an electric signal. The light separation unit 51 includes an optical coupler, and separates light emitted from the incident end 31 of the rare-earth doped fiber 30 toward the signal light source 10, and enters the separated light into the photoelectric conversion unit 52. That is, the light detection unit 50 detects the intensity of light proceeding in a direction opposite to the emitting direction of the signal light. Further, the photoelectric conversion unit 52 includes a photoelectric conversion element, such as a photodiode, which causes the light that is incident from the light separation unit 51 to be subjected to photoelectric conversion, and outputs an electric signal based on the intensity of the light incident form the light separation unit 51 to the control unit 60.

The control unit 60 includes a light source control unit 61 and a comparator 62 that compares the voltage of the signal input from the photoelectric conversion unit 52 with a reference voltage. After making such a comparison, the comparator 62 outputs a signal indicating the results thereof to the light source control unit 61. The light source control unit 61 includes a logic gate and a central processing unit (CPU), and generates a control signal based on the signal from the comparator 62. The generated control signal is then input to the pumping light source 20, with the pumping light source 20 causing the intensity of the pumping light to be emitted to be dependent upon the control signal. Therefore, the intensity of emission coming from the pumping light source 20 varies based on the control signal of the light source control unit 61. Furthermore, in the present embodiment, the light source control unit 61 controls other light sources 10 besides the pumping light source 20. For example, the light source control unit 61 can control the intensity of the signal light emitted from the signal light source 10, the duty ratio of the pulsed signal light, and the like.

The filter 70 is arranged in an optical path of light emitted from the rare-earth doped fiber 30 of the light emitting unit 5. In the present embodiment, the filter 70 does not allow for transmission of light in at least a portion of the wavelength band, including wavelengths on a shorter side than the wavelength of the signal light, and those with which a gain is maximized in the rare-earth doped fiber 30. The filter 70 allows for the transmission of the signal light and light that is on a longer wavelength band than the wavelength of the signal light. For example, when the rare-earth doped fiber 30 is an optical fiber in which ytterbium is doped, that has a maximized gain around 1030 nm wavelength, and the wavelength of the signal light is 1085 nm, the filter 70 does not allow transmission of light having a wavelength of 1070 nm or less. However, the filter does allow for transmission of light on wavelength sides that are longer than 1070 nm.

An example of such a filter 70 includes a filter with filter film formed on glass. An example of such a filter film includes a multilayer in which several types of metal oxide films are layered repeatedly. Further, the filter 70 is preferably arranged in such a manner that the filter surface is at an incline with respect to the travel direction of the light emitted from the rare-earth doped fiber 30, as illustrated in FIG. 1. With the filter surface arranged at an incline, reflected light is readily and properly removed when the filter 70 reflects the light that is forbidden for which transmission is prevented.

The optical isolator 75 is configured to transmit light proceeding in the same direction as the signal light emitted from the rare-earth doped fiber 30, and to avoids the incidence of light proceeding in an opposite direction to the travel direction of the signal light to the light emitting unit 5. Further, in the present embodiment, the optical isolator 75 is configured to avoids the majority of the incident light with the same wavelength as the signal light on the light emitting unit 5, among the lights proceeding in a direction opposite to the travel direction of the signal light. That is, the optical isolator 75 conducts maximum isolation with respect to the light that has the same wavelength as that of the signal light which is emitted from the signal light source 10.

Next, the operation of the fiber laser 1 of this kind will be described.

First, a control signal is input from the light source control unit 61 to the signal light source 10. Then, the optical switch 11 of the signal light source 10 performs a switching operation such that the signal light repeats a low- and high-loss state with a predetermined constant period. Then, the pulsed signal light that is synchronized with the switching operation is emitted from the signal light source 10 with the constant period. At this time, the signal light emitted from the signal light source 10 is, for example, a light having a wavelength of 1085 nm, as described above, and the duty ratio of the signal light is, for example, "a time period in which the signal light is not emitted from the signal light source 10":"a time period in which the signal light is emitted from the signal light source 10" of 10:1. The signal light emitted from the signal light source 10 propagates through the core of the signal light fiber 15, and is incident on the combiner 40.

Further, the pumping light is emitted from each of the laser diodes 21 of the pumping light source 20. The pumping light emitted from each of the laser diodes 21 of the pumping light source 20 has, for example, a wavelength of 915 nm, as described above. Then, the pumping light emitted from each of the laser diodes 21 propagates through the pumping light fiber 22 and is incident on the combiner 40.

The pulsed signal light incident on the combiner 40 under this method is incident from the incident end 31 of the rare-earth doped fiber 30 on the core, and propagates through the core. Meanwhile, the pumping light incident on the combiner 40 is incident from the incident end 31 of the rare-earth doped fiber 30 to the clad, and mainly propagates through the clad.

In the rare-earth doped fiber 30 through which the pumping light propagates, the pumping light is absorbed in the rare-earth element doped in the core when the pumping light passes through the core and the rare-earth element is pumped. During the time period in which the signal light is not incident on the rare-earth doped fiber 30, the pumping of the rare-earth element accelerates. Meanwhile, when the pulsed signal light is incident on the rare-earth doped fiber 30, the pumped rare-earth element induces emission by the signal light, and the signal light is amplified by the induced emission. Moreover, the pulsed output light is emitted from the emitting end 32 of the rare-earth doped fiber 30.

Figure 3:
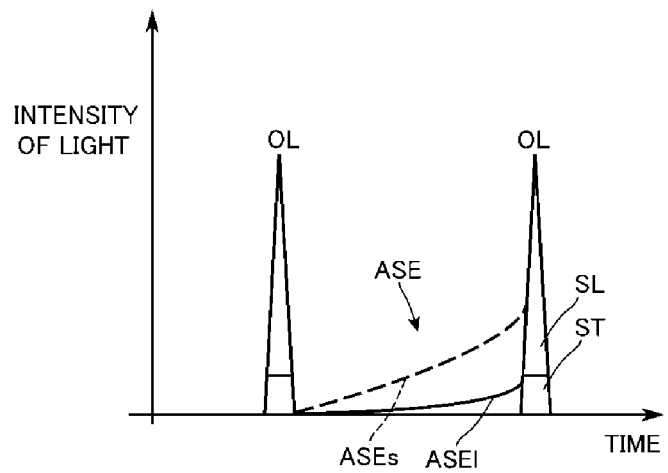
FIG. 3 is a diagram schematically illustrating light output intensity from the rare-earth doped fiber of FIG. 1.

FIG. 3 is a diagram illustrating the intensity of light emitted from the rare-earth doped fiber 30. During the time period in which the signal light is incident on the rare-earth doped fiber 30 as described above, the high intensity output light OL is emitted from the rare-earth doped fiber 30. At this time, in the rare-earth doped fiber 30, the wavelength of part of the signal light may shift toward the side of a longer wavelength because of a nonlinear optical effect. In this case, the output light OL, which is emitted from the rare-earth doped fiber 30, includes a signal light SL and Stokes ray ST, with the signal light SL being shifted toward the longer wavelength side.

Meanwhile, during the time period in which the signal light is not incident on the rare-earth doped fiber 30, ASE light in an accelerated pumping state is emitted from the rare-earth element. This ASE light includes light ASEs having a large bandwidth wavelength on a side with a shorter wavelength than that of the signal light emitted from the signal light source 10. Moreover, it includes light ASEl on a longer wavelength than the wavelength of the signal light emitted from the signal light source 10. The ASE light has low intensity. When the ASE light is generated, the ASE light generated in the rare-earth doped fiber 30 is amplified. Additionally, the signal light emitted from the signal light source 10 is light with a longer wavelength than that with the highest gain in the rare-earth doped fiber 30. Therefore, the light ASEs on a side with a shorter wavelength than the signal light are amplified with a higher gain than the light ASEl on the side with a longer wavelength than the signal light, as illustrated in FIG. 3. In this way, the ASE light having the light ASEl on a side with a shorter wavelength than the signal light amplified with the higher gain is emitted from the emitting end 32 of the rare-earth doped fiber 30.

The light emitted from the rare-earth doped fiber 30 is incident on the filter 70 through the optical isolator 75. Then, the light having the same wavelength as the wavelength of the signal light is emitted from the signal light source 10, and light in a wavelength band on a side with a longer wavelength than that of the signal light emitted from the signal light source 10 is transmitted through the filter 70. Meanwhile, light in at least a part of a wavelength band that includes a wavelength on a side with a shorter wavelength than that of the signal light with a maximized gain in the rare-earth doped fiber 30 cannot be transmitted through the filter 70.

As described above, the wavelength of the signal light emitted from the signal light source 10 is a wavelength that is longer than that with which the rare-earth doped fiber has the maximum gain. Therefore, during the time period in which the signal light is incident from the signal light source 10 to the rare-earth doped fiber 30, the output light OL, including the signal light SL and the Stokes ray ST, are transmitted through the filter 70, and are emitted from the fiber laser 1. During this time period, the ASE light is not emitted from the rare-earth doped fiber 30, the output light OL which is emitted from the light emitting unit 5 includes little light on a side with a shorter wavelength than that of the signal light SL. Therefore, the output light intensity OL of light emitted from the light emitting unit 5 is hardly weakened by the filter 70. In this way, a high intensity pulsed output light OL is emitted from the fiber laser 1.

Meanwhile, during the time period in which the signal light is not incident from the signal light source 10 to the rare-earth doped fiber 30, the ASE light amplified in the manner described above is incident on the filter 70. Among the ASE lights, the light ASEl with a longer wavelength than that of the signal light that is emitted from the signal light source 10 is transmitted through the filter 70. However, among the light ASEs having a shorter wavelength than the wavelength of the signal light emitted from the signal light source 10, light in at least a part of a wavelength band including a wavelength with which the gain is maximized in the rare-earth doped fiber 30 is not transmitted through the filter 70. Instead, it is reflected on the filter 70, and absorbed in a non-reflector (not illustrated).

For example, if the rare-earth doped fiber 30 is an optical fiber with a wavelength in the vicinity of 1030 nm, for which the gain is maximized, and the wavelength of the signal light emitted from the signal light source 10 is 1085 nm, the filter 70 would not allow transmission of light having a wavelength of 1070 nm or less, as described above. In this case, among the ASE lights, many light ASEs, including lights amplified with a high gain in the rare-earth doped fiber 30, are reflected on the filter 70 towards an outside line into which the signal light propagates, and are not transmitted through the filter 70. Meanwhile, the rest of the light ASEs, with the exception of light amplified with high gain in the rare-earth doped fiber 30, and the light ASEl of a longer wavelength than the signal light amplified with a low gain in the rare-earth doped fiber 30, are transmitted through the filter 70. In this way, light with a lower intensity that is in a larger wavelength band than the signal light is emitted.

When the fiber laser 1 is used, a body to be irradiated, such as a body to be processed, is irradiated with the light emitted from the fiber laser 1. At this time, a portion of the light irradiated to the body to be irradiated is reflected at the body to be irradiated, and is incident on the fiber laser 1 again as reflected light.

The reflected light that is incident on the fiber laser 1 is incident on the filter 70. The reflected light is composed of a part of the light emitted from the fiber laser 1. Therefore, during the time period in which the output light OL is emitted from the fiber laser 1, the reflected light is constructed of a portion of the emitted signal light SL, and the Stokes ray ST. During the period in which the ASE light is emitted from the fiber laser 1, the reflected light is constructed of a portion of the light ASEl and a portion of the light that does not include the light amplified with the high gain in the rare-earth doped fiber 30, among the light ASEe. Such light is light that has the wavelength transmitted through the filter 70 at the time of emission. Therefore, the reflected light is transmitted through the filter 70 as well.

The reflected light that is transmitted through the filter 70 is incident on the optical isolator 75. From there, much of that light 75 is avoided in order to be incident on the light emitting unit 5 by the light isolation by means of optical isolator 75. Note, the signal light SL has the highest intensity among the lights OL emitted from the fiber laser 1. Therefore, in most cases, the signal light SL has the highest intensity even for reflected light. However, in the embodiment described above, the optical isolator 75 conducts the maximum isolation with respect to the light having the same wavelength as that of the signal light emitted from the signal light source 10. Therefore, the reflected light that is incident on the optical isolator 75 is avoided in order to be incident on the light emitting unit 5.

Here, a portion of the light that is to be reflected and incident on the optical isolator 75 is not isolated. Rather, it is incident on the light emitting unit 5. The light incident on the light emitting unit 5 is incident on the rare-earth doped fiber 30 from the emitting end 32 of the rare-earth doped fiber 30 and is amplified by a pumped rare-earth element.

The reflected light amplified in the rare-earth doped fiber 30 proceeds to the signal light source 10 from the incident end 31 of the rare-earth doped fiber 30. If this occurs during the time period in which the signal light is emitted from the signal light source 10, the amplified reflected light proceeding to the signal light source 10 from the incident end 31 of the rare-earth doped fiber 30 becomes light having the same wavelength as the signal light SL and the Stokes ray ST. Meanwhile, if, during this time period, the signal light is not emitted from the signal light source 10, even though the amplified reflected light is composed of light ASEl and light in a wavelength band that is transmittable through the filter with the light ASEs, the light proceeding to the signal light source 10 from the incident end 31 of the rare-earth doped fiber 30 includes ASE light that is newly generated in the rare-earth doped fiber 30 and emitted from the incident end 31, other than the amplified reflected light.

From there, the light proceeding to the signal light source 10 from the incident end 31 of the rare-earth doped fiber 30 is, at the least, partially separated in the light separation unit 51 of the light detection unit 50, and is incident on the photoelectric conversion unit 52. The photoelectric conversion unit 52 outputs a signal to the control unit 60 based on the intensity of the light incident from the light separation unit 51.

When the signal is input to the control unit 60 from the photoelectric conversion unit 52, the comparator 62 compares the voltage of the signal with the reference voltage Vcc. If the voltage of the signal output from the photoelectric conversion unit 52 is less than the reference voltage Vcc, the comparator 62 outputs a signal to the light source control unit indicating that the voltage of the signal from the photoelectric conversion unit 52 is low. For example, this signal is a signal having a low voltage . In this case, the light source control unit 61 would determine that the intensity of the light proceeding to the signal light source 10 from the incident end 31 of the rare-earth doped fiber 30 is low, and would not output a special control signal to the pumping light source 20. That is, the pumping light source 20 emits the pumping light with normal intensity if the light incident on the light detection unit 50 has an intensity that is lower than the predetermined intensity.

Meanwhile, if the intensity of the light proceeding to the signal light source 10 from the incident end 31 of the rare-earth doped fiber 30 is higher than the predetermined intensity, the voltage of the signal that is output from the photoelectric conversion unit 52 heightens, and the comparator would determine that the voltage output from the photoelectric conversion unit 52 is higher than the reference voltage Vcc. In such a case, the comparator 62 would output a signal indicating that the voltage of the signal from the photoelectric conversion unit 52 is high to the light source control unit 61. This signal is a signal having a high voltage, for example. When this signal is input to the light source control unit 61, the light source control unit 61 would determine that the intensity of the light proceeding to the signal light source 10 from the incident end 31 of the rare-earth doped fiber 30 is high, and would place controls on the pumping light source 20 to cause the intensity of the pumping light emitted from the pumping light source 20 to be low. That is, the pumping light source 20 causes the intensity of the pumping light to lessen when the intensity of the light incident on the light detection unit 50 is higher than the predetermined intensity.

As described above, the intensity of the light proceeding in a direction opposite to the emitting direction of the signal light is monitored, and the intensity of the pumping light is adjusted based on the intensity of the light, causing the gain of the rare-earth doped fiber 30 to be reduced. This further suppresses internal damage caused by reflected light.

Note that amongst the light that is transmittable through the filter 70, light that is reflected by the signal light is more likely to induce damage to the signal light source 10, and the like. Therefore, when the intensity of the reflected light is higher than the predetermined intensity, monitoring the light reflected by the signal light may cause the intensity of the pumping light to lessen. Monitoring the light reflected by the signal light involves monitoring when the intensity of the light proceeding in a direction opposite to the emitting direction of the signal light rises as the reflected light. This is done by focusing on the fact that the reflected light of the signal light is pulsed because the signal light is also pulsed. By monitoring the light reflected by the signal light in this manner, the damage to the signal light source 10 and the like can be further suppressed.

Further, in order to monitor the reflected light of the signal light, the light separation unit 51 has wavelength selectivity. Therefore, light having the same wavelength as the signal light is separated, and may be incident on the photoelectric conversion unit 52. An example of the light separation unit 51 includes an optical coupler with wavelength selectivity. Since the wavelength of the reflected light is the same as that of the signal light, by configuring the light separation unit 51 to have such wavelength selectivity, both the incidence of reflected light and the incidence of ASE light on the photoelectric conversion unit 52 can be substantially reduced. Therefore, monitoring of the reflected light becomes less burdensome.

As described above, according to the fiber laser 1 of the present invention, even if the ASE light is emitted, at the very least, the light that is amplified in the rare-earth doped fiber 30 with a maximum gain among the ASE light is removed by the filter 70 rather than emitted. Therefore, even if the ASE light that is emitted is reflected at the body to be processed, and the like, and is then incident on the fiber laser 1 again, the light that is reflected would not include the light amplified in the rare-earth doped fiber 30 with the maximum gain. With the light amplified by the maximum gain being removed, amplification of the reflected light in the rare-earth doped fiber 30 with the high gain can be suppressed. Therefore, internal damage due to the reflected light can be suppressed.

Further, even in the case where the wavelength in a part of the amplified signal light is shifted to a side with a longer wavelength, the Stokes ray ST, with the shifted wavelength, can be transmitted through the filter 70. Therefore, the decline in the intensity of the output light OL that is transmitted through the filter 70 and emitted can be avoided. This allows for the suppression of internal damage caused by reflected light, while also allowing for a avoidance of the decline in the intensity of the output light OL.

(Second Embodiment)

Next, a second embodiment of the present invention will be described in detail with reference to FIG. 4. Note that the same or equivalent configuration elements to the first embodiment will be denoted with the same reference signs unless otherwise specifically noted. Overlapping descriptions are not repeated here.

Figure 4:
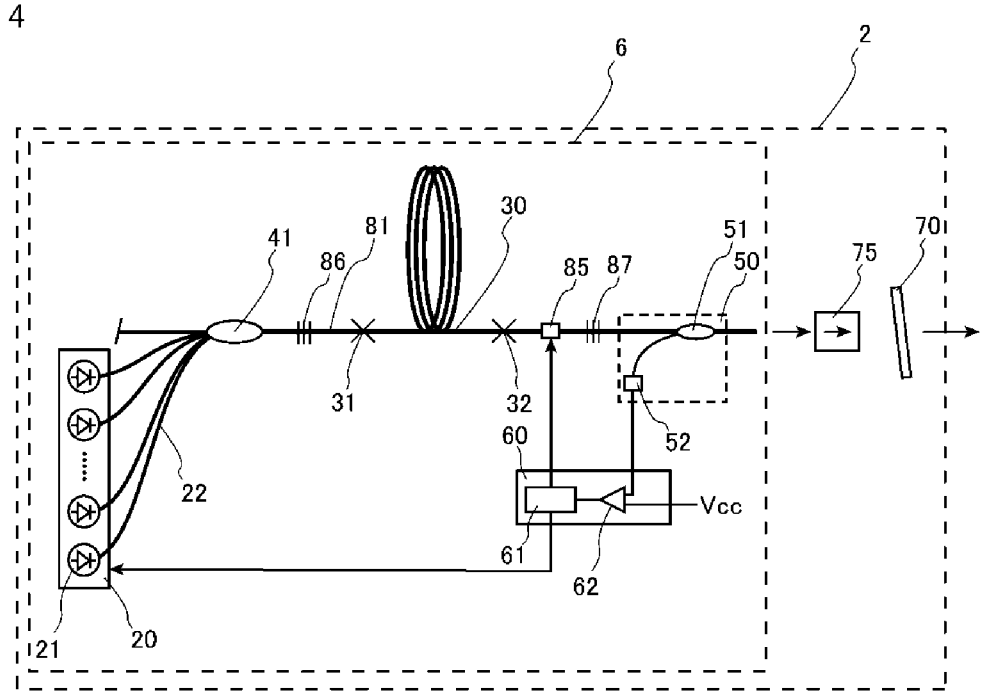
FIG. 4 is a diagram illustrating a fiber laser according to a second embodiment of the present invention.

FIG. 4 is a diagram illustrating a fiber laser according to a second embodiment of the present invention. As illustrated in FIG. 4, a fiber laser 2 of the present embodiment is different from the fiber laser 1 of the first embodiment in that the light emitting unit 6 is used in place of the light emitting unit 5 in the first embodiment.

The light emitting unit 6 includes, as a main configuration: a pumping light source 20, a rare-earth doped fiber 30, a first optical fiber 81 connected to an incident end 31 of the rare-earth doped fiber 30, a first fiber Bragg grating (FBG) 86 as a first mirror provided in the first optical fiber 81, a combiner 41 for entering pumping light into the first optical fiber 81, a second optical fiber 82 connected to an emitting end 32 of the rare-earth doped fiber 30, a second FBG 87 as a second mirror provided in the second optical fiber 82, an optical switch 85 provided between the first FBG 86 and the second FBG 87, a light detection unit 50 arranged between a light emitting end side and the second FBG 87, and a control unit 60. As described above, the fiber laser 2 is a resonator type fiber laser.

The first optical fiber 81 has a core with a similar diameter to the core of the rare-earth doped fiber 30, and has a clad with a similar external diameter to the clad of the rare-earth doped fiber 30. Therefore, the core of the rare-earth doped fiber 30 and the core of the first optical fiber 81 are optically coupled with each other, while the clad of the rare-earth doped fiber 30 is optically coupled with the clad of the first optical fiber 81.

Further, an end portion on a side opposite to the side connected to the rare-earth doped fiber 30 of the first optical fiber 81 is connected to the combiner 41, and in the combiner 41, the core of the pumping light fiber 22 is connected to the clad of the first optical fiber 81. Therefore, pumping light that is emitted from the pumping light source 20 is incident on the first optical fiber 81.

Further, the first FBG 86 is provided in the core of the first optical fiber 81. In this way, the first FBG 86 is provided on a side opposite to an emitting side of the rare-earth doped fiber 30. The first FBG 86 has portions with a high refractive index that are repeated with a constant period along a longitudinal direction of the first optical fiber 81. By adjusting the period, the first FBG 86 is configured to reflect light having a longer wavelength than a wavelength with which a gain is maximized in the rare-earth doped fiber 30, among the wavelength bands of light that are released by a rare-earth element of the rare-earth doped fiber 30 in a pumping state. For example, as described above, if the first FBG 86 has a reflectance of 100% in 1085 nm when the rare earth to be doped to the rare-earth doped fiber 30 is ytterbium.

The second optical fiber 82 connected to the emitting end 32 of the rare-earth doped fiber 30 has a core with a similar diameter to that of the rare-earth doped fiber 30. Therefore, the core of the rare-earth doped fiber 30 and the core of the second optical fiber 82 are optically connected to each other.

Further, the second FBG 87 is provided in the core of the second optical fiber 82. In this way, the second FBG 87 is provided on the emitting side of the rare-earth doped fiber 30. The second FBG 87 has portions with a high refractive index that are repeated with a constant period along a longitudinal direction of the second optical fiber 82, and are configured to reflect light with the same wavelength as the light reflected by the first FBG 86, with a lower reflectance than that of the first FBG 86. For example, the second FBG 87 is configured to reflect light with the same wavelength as the light reflected by the first FBG 86 with 50% reflectance.

The optical switch 85 that is provided in the second optical fiber is configured from a similar device as the optical switch 85 in the signal light source 10 of the first embodiment. Moreover, it is subjected to a switching control that causes the light with a wavelength reflected at the first FBG 86 and the second FBG 87 to repeat a low- and high-loss state. When the optical switch 85 is in the low-loss state, all of the light incident on the optical switch 85 is transmitted through the optical switch 85. Meanwhile, when the optical switch 85 is in the high-loss state, most of the light that is incident on the optical switch 85, if it has a wavelength reflected at the first FBG 86 and the second FBG 87, is lost. Light of other wavelengths is transmitted through the optical switch 85.

The light separation unit 51 of the light detection unit 50 is provided in the middle of the second optical fiber 82. It separates the light emitted toward the side of the rare-earth doped fiber 30 from the emitting end of the second optical fiber 82, and enters the light into the photoelectric conversion unit 52. Therefore, similar to the light detection unit 50 of the first embodiment, the light detection unit 50 of the present embodiment detects the intensity of the light proceeding in a direction opposite to the emitting direction of the signal light.

In the first embodiment, the control unit 60 controls the pumping light source 20 and the signal light source 10. However, in the present embodiment, the control unit 60 controls the pumping light source 20 and the optical switch 85. Further, the light source control unit 61 exerts control over the pumping light source 20 and the optical switch 85 based on a signal from a comparator 62 to control the intensity of the pumping light, a duty ratio of emitted pulsed signal light described below, and the like.

Next, operation of the fiber laser 2 will be described.

First, pumping light is emitted from each laser diode 21 of the pumping light source 20, and the optical switch 85 performs a switching operation in order to repeat a low- and high-loss state with a predetermined constant period.

When the pumping light is emitted from the pumping light source 20, the pumping light is incident on the clad of the first optical fiber 81 in the combiner 41, and is incident on the clad of the rare-earth doped fiber 30 from the clad of the first optical fiber 81. From there, similar to the first embodiment, a rare-earth element doped in the core of the rare-earth doped fiber 30 is pumped. Then, the rare-earth element in the pumping state releases ASE light. At this time, the ASE light is similar to that in the first embodiment. For example, light in a central wavelength has a wide wavelength band in the vicinity of 1030 nm.

Here, when the optical switch 85 is in the high-loss state, the light with a wavelength reflected at the first FBG 86 and the second FBG 87 is lost at the optical switch 85 among the ASE light, and light other than that described above is transmitted through the optical switch 85. The ASE light transmitted through the optical switch 85 is light with a wavelength other than that reflected at the second FBG 87. Therefore, the ASE light is transmitted through the second FBG 87, and is emitted from the second optical fiber. In this way, the ASE light is emitted from the light emitting unit 6. Similar to the ASE light shown in FIG. 3, this ASE light is composed of ASEs on a shorter wavelength side than the signal light described below, as well as ASE1 that is on a shorter wavelength side than the signal light described below.

As described above, during a time period in which the optical switch 85 is in high loss, a pumping state of the rare-earth element of the rare-earth doped fiber 30 heightens. When the optical switch 85 enters the low-loss state, approximately all of generated ASE light is transmitted through the optical switch 85. Then, among the ASE lights, the light having a wavelength reflected at the first FBG 86 and the second FBG 87 resonates between the first FBG 86 and the second FBG 87, and is amplified by the induced emission of the pumped rare-earth element of the rare-earth doped fiber 30. In the present embodiment, the light reflected at the first FBG 86 and the second FBG 87 that is amplified while resonating is the signal light. Therefore, the wavelength of the signal light is light that has a wavelength reflected at the first FBG 86 and the second FBG 87, and light that has a longer wavelength than the wavelength with which the gain is maximized in the rare-earth doped fiber 30. A part of the signal light amplified in this way is transmitted through the second FBG 87 and is emitted from the second optical fiber 82 as output light. As described above, since the optical switch 85 performs a switching operation with a constant period, the output light emitted from the second optical fiber 82 becomes pulsed light. In this way, the pulsed output light is emitted from the light emitting unit 6. At this time, a part of the signal light may shift toward a longer wavelength side by nonlinear optical effect. Therefore, similar to the output light OL in the first embodiment, the output light is made of signal light SL illustrated in FIG. 3, and Stokes ray ST having a longer wavelength than that of signal light SL.

The ASE and output lights that are emitted from the light emitting unit 6 are similar to those that are emitted from the light emitting unit 5 in the first embodiment. Therefore, during the time period in which the output light is emitted from the light emitting unit 6, the output light OL, composed of the signal light SL and the Stokes ray ST, is transmitted through the filter 70 and is emitted from the fiber laser 1. The intensity of the output light OL hardly declines due to the filter 70. In this way, high intensity pulsed output light OL is emitted from the fiber laser 2. Meanwhile, during the time period in which the output light OL is not emitted from the light emitting unit 6, the ASE light is emitted from the light emitting unit 6, as described above. Among the ASE lights, the light ASE1 with a longer wavelength than the signal light is transmitted through the filter 70. However, among the light ASEs having a shorter wavelength than the signal light, light in at least a part of wavelength bands, including a wavelength in which a gain is maximized in the rare-earth doped fiber 30, that is not transmitted through the filter 70, is reflected on the filter 70, and absorbed in a non-reflector.

The light that is emitted from the fiber laser 2 may be reflected at a body to be irradiated and may be incident on the fiber laser 2 as reflected light, similar to the light emitted from the fiber laser 1 in the first embodiment. In this case, the light is transmitted through the filter 70, similar to the reflected light in the first embodiment, and is incident on a optical isolator 75. From there, apart of the reflected light may be incident on the light emitting unit 6 without being isolated in the optical isolator 75.

At least a part of the reflected light that is incident on the light emitting unit 6 is separated in the light separation unit 51 of the light detection unit 50. Moreover, a signal similar to the first embodiment is input to the control unit 60. Then, similar to the first embodiment, the control unit 60 causes the intensity of the pumping light that is emitted from the pumping light source 20 to enlarge when the light incident on the light detection unit 50 is lower than the predetermined intensity. Further, it controls the pumping light source 20 in order to cause the intensity of the pumping light emitted from the pumping light source 20 to decline when the light incident on the light detection unit 50 is higher than the predetermined intensity.

In the present embodiment, even where a portion of the light incident on the light emitting unit 6 that is transmitted through the second FBG 87 is incident on the rare-earth doped fiber 30, and amplified by a pumped rare-earth element, the reflected light does not include light having a wavelength with which the gain is maximized in the rare-earth doped fiber 30. Therefore, damage to a resonance structure or the pumping light source is suppressed.

Further, as described above, since the intensity of the reflected light is monitored by the light detection unit 50 and the control unit 60, and the intensity of the pumping light is controlled according to the intensity of the reflected light, damage to the resonance structure and the pumping light source is further suppressed.

The present invention has been described through a discussion of the first and second embodiments, which served as examples. However, it should be noted that the present invention is not limited to these examples.

For instance, in the fiber lasers 1 and 2 that are described in the embodiments above, the optical isolator 75 may not be included.

Further, in the fiber lasers 1 and 2 of the above described embodiments, the reflected light is monitored by the light detection unit 50 and the control unit 60. However, the reflected light may also be monitored by other methods. Moreover, the fiber laser may not include the light detection unit 50 and the control unit 60, and the reflected light may not be specially monitored.

As described above, according to the present invention, a fiber laser configured to suppress internal damage caused by reflected light, while also avoiding a decline in the intensity of output light is provided. It is expected that it will be implemented in fields that use a laser beam, such as those that deal with processing machines and medical equipment.

What is claimed is:

1. A fiber laser comprising:
   a light emitting unit including a pumping light source configured to emit pumping light, and a rare-earth doped fiber on which the pumping light is incident, and to which a rare-earth element that is to be pumped by the pumping light is doped, the light emitting unit being configured to amplify pulsed signal light in the rare-earth doped fiber and to emit light including the signal light; and
   a filter arranged in an optical path of the output light emitted from the light emitting unit, wherein
   a wavelength of the signal light is longer than a wavelength with which a gain is maximized in the rare-earth doped fiber within a gain wavelength band of the rare-earth doped fiber, and
   the filter does not allow transmission of light in at least a part of a wavelength band including the wavelength with which a gain is maximized in the rare-earth doped fiber, and allows transmission of light with the same wavelength as the signal light and light in a wavelength band on a side with a longer wavelength than the wavelength of the signal light.

2. The fiber laser according to claim 1, wherein the filter does not allow transmission of all light on a side with a shorter wavelength than the wavelength of the signal light within the gain wavelength band of the rare-earth doped fiber.

3. The fiber laser according to claim 1, wherein
   the light emitting unit further includes a light detection unit configured to detect intensity of light proceeding in a direction opposite to an emitting direction of the signal light, and a control unit configured to control the pumping light source, and
   the control unit controls the intensity of the pumping light to contract when determining the light proceeding in a direction opposite to an emitting direction of the signal light has predetermined intensity or more, based on an output from the light detection unit.

4. The fiber laser according to claim 1, wherein a optical isolator is provided in the optical path of the output light between the light emitting unit and the filter, the optical isolator being configured to allow transmission of light proceeding in a travel direction of the output light and to suppress an incidence of light to the light emitting unit, the light proceeding in a direction opposite to the travel direction of the output light.

5. The fiber laser according to claim 1,
   wherein the rare-earth element is ytterbium,
   the signal light is light having a wavelength of 1070 nm or more, and
   the filter does not allow transmission of light having a shorter wavelength than 1070 nm at least within the gain wavelength band of the rare-earth doped fiber.

6. The fiber laser according to claim 1, wherein
   the light emitting unit further includes a signal light source configured to emit pulsed signal light, and
   the signal light emitted from the signal light source is incident on the rare-earth doped fiber.

7. The fiber laser according to claim 1, wherein the light emitting unit further includes
   a first mirror provided on a side opposite to an emitting side of the rare-earth doped fiber, and configured to reflect light having a wavelength equal to a wavelength of the signal light,
   a second mirror provided on the emitting side of the rare-earth doped fiber, and configured to reflect light having a wavelength equal to a wavelength of the light reflected by the first mirror with lower reflectance than reflectance of the first mirror, and
   an optical switch provided between the first mirror and the second mirror, and configured to cause light having a wavelength equal to a wavelength of the signal light to repeat a low- and high-loss state,
   wherein the signal light is light resonating between the first mirror and the second mirror.

8. The fiber laser according to claim 2, wherein
   the light emitting unit further includes a signal light source configured to emit pulsed signal light, and
   the signal light emitted from the signal light source is incident on the rare-earth doped fiber.

9. The fiber laser according to claim 3, wherein
   the light emitting unit further includes a signal light source configured to emit pulsed signal light, and
   the signal light emitted from the signal light source is incident on the rare-earth doped fiber.

10. The fiber laser according to claim 4, wherein
    the light emitting unit further includes a signal light source configured to emit pulsed signal light, and
    the signal light emitted from the signal light source is incident on the rare-earth doped fiber.

11. The fiber laser according to claim 5, wherein
the light emitting unit further includes a signal light source configured to emit pulsed signal light, and
the signal light emitted from the signal light source is incident on the rare-earth doped fiber.

12. The fiber laser according to claim 2,
wherein the light emitting unit further includes
a first mirror provided on a side opposite to an emitting side of the rare-earth doped fiber, and configured to reflect light having a wavelength equal to a wavelength of the signal light,
a second mirror provided on the emitting side of the rare-earth doped fiber, and configured to reflect light having a wavelength equal to a wavelength of the light reflected by the first mirror with lower reflectance than reflectance of the first mirror, and
an optical switch provided between the first mirror and the second mirror, and configured to cause light having a wavelength equal to a wavelength of the signal light to repeat a low- and high-loss state,
wherein the signal light is light resonating between the first mirror and the second mirror.

13. The fiber laser according to claim 3,
wherein the light emitting unit further includes
a first mirror provided on a side opposite to an emitting side of the rare-earth doped fiber, and configured to reflect light having a wavelength equal to a wavelength of the signal light,
a second mirror provided on the emitting side of the rare-earth doped fiber, and configured to reflect light having a wavelength equal to a wavelength of the light reflected by the first mirror with lower reflectance than reflectance of the first mirror, and
an optical switch provided between the first mirror and the second mirror, and configured to cause light having a wavelength equal to a wavelength of the signal light to repeat a low- and high-loss state,
wherein the signal light is light resonating between the first mirror and the second mirror.

14. The fiber laser according to claim 4,
wherein the light emitting unit further includes
a first mirror provided on a side opposite to an emitting side of the rare-earth doped fiber, and configured to reflect light having a wavelength equal to a wavelength of the signal light,
a second mirror provided on the emitting side of the rare-earth doped fiber, and configured to reflect light having a wavelength equal to a wavelength of the light reflected by the first mirror with lower reflectance than reflectance of the first mirror, and
an optical switch provided between the first mirror and the second mirror, and configured to cause light having a wavelength equal to a wavelength of the signal light to repeat a low- and high-loss state,
wherein the signal light is light resonating between the first mirror and the second mirror.

15. The fiber laser according to claim 5,
wherein the light emitting unit further includes
a first mirror provided on a side opposite to an emitting side of the rare-earth doped fiber, and configured to reflect light having a wavelength equal to a wavelength of the signal light,
a second mirror provided on the emitting side of the rare-earth doped fiber, and configured to reflect light having a wavelength equal to a wavelength of the light reflected by the first mirror with lower reflectance than reflectance of the first mirror, and
an optical switch provided between the first mirror and the second mirror, and configured to cause light having a wavelength equal to a wavelength of the signal light to repeat a low- and high-loss state,
wherein the signal light is light resonating between the first mirror and the second mirror.

16. The fiber laser according to claim 6,
wherein the signal light source emits pulsed signal light with an interval, and
the light emitting unit emits an amplified spontaneous emission (ASE) light during the interval.

17. The fiber laser according to claim 3,
wherein the light detection unit detects intensity of reflected light reflected back from an outside of the fiber laser and proceeding in a direction opposite to the emitting direction of the signal light.

18. The fiber laser according to claim 3,
wherein the control unit does not control the intensity of the pumping light when determining the light proceeding in the direction opposite to the emitting direction of the signal light has an intensity less than predetermined intensity, based on the output from the light detection unit.

* * * * *